(12) United States Patent
Ko et al.

(10) Patent No.: US 12,033,910 B2
(45) Date of Patent: Jul. 9, 2024

(54) WAFER-LEVEL STACK CHIP PACKAGE AND METHOD OF MANUFACTURING THE SAME

(71) Applicant: Amkor Technology Singapore Holding Pte. Ltd., Singapore (SG)

(72) Inventors: Yeong Beom Ko, Gwangju (KR); Dong Jin Kim, Gwangju (KR); Se Woong Cha, Gyeonggi-do (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 17/028,329

(22) Filed: Sep. 22, 2020

(65) Prior Publication Data

US 2021/0020535 A1 Jan. 21, 2021

Related U.S. Application Data

(63) Continuation of application No. 14/931,112, filed on Nov. 3, 2015, now Pat. No. 10,784,178.

(30) Foreign Application Priority Data

Nov. 5, 2014 (KR) ........................ 10-2014-0152687

(51) Int. Cl.
*H01L 23/31* (2006.01)
*H01L 21/56* (2006.01)
(Continued)

(52) U.S. Cl.
CPC ........ *H01L 23/3185* (2013.01); *H01L 21/561* (2013.01); *H01L 21/78* (2013.01);
(Continued)

(58) Field of Classification Search
CPC ......... H01L 23/49827; H01L 23/49811; H01L 23/49833; H01L 23/5389; H01L 23/3185;
(Continued)

(56) References Cited

U.S. PATENT DOCUMENTS 6,730,998 B1 * 5/2004 Williams ............... B33Y 80/00
257/713
8,446,017 B2 5/2013 Paek et al.
(Continued)

FOREIGN PATENT DOCUMENTS

KR 1020110115812 A 10/2011
KR 1020120127460 A 11/2012
(Continued)

OTHER PUBLICATIONS

Korean Office Action in 10-2014-0152687 dated Oct. 19, 2015 (5 pages).
(Continued)

*Primary Examiner* — Vongsavanh Sengdara
(74) *Attorney, Agent, or Firm* — McAndrews, Held & Malloy, Ltd.

(57) ABSTRACT

A semiconductor product in the form of a stack chip package and a method of manufacturing the same, where a plurality of semiconductor chips are stacked one on another so as to enable the exchange of electrical signals between the semiconductor chips, and where a conductive layer is included for inputting and outputting signals to and from individual chips. A stack chip package having a compact size may, for example, be manufactured by stacking, on a first semiconductor chip, a second semiconductor chip having a smaller surface area by means of interconnection structures so as to enable the exchange of electrical signals between the first and second semiconductor chips, and by using a conductive layer for inputting and outputting signals to and from
(Continued)

individual semiconductor chips, in lieu of a thick substrate. Furthermore, heat dissipation effects can be enhanced by the addition of a heat dissipation unit.

20 Claims, 6 Drawing Sheets

(51) Int. Cl.
*H01L 21/78* (2006.01)
*H01L 23/00* (2006.01)
*H01L 23/498* (2006.01)
*H01L 23/538* (2006.01)

(52) U.S. Cl.
CPC .... *H01L 23/3114* (2013.01); *H01L 23/49811* (2013.01); *H01L 23/49827* (2013.01); *H01L 23/49833* (2013.01); *H01L 23/5389* (2013.01); *H01L 24/19* (2013.01); *H01L 24/20* (2013.01); *H01L 24/94* (2013.01); *H01L 24/96* (2013.01); *H01L 24/97* (2013.01); *H01L 24/05* (2013.01); *H01L 24/13* (2013.01); *H01L 24/16* (2013.01); *H01L 24/73* (2013.01); *H01L 24/81* (2013.01); *H01L 24/92* (2013.01); *H01L 2224/0401* (2013.01); *H01L 2224/04105* (2013.01); *H01L 2224/05624* (2013.01); *H01L 2224/05644* (2013.01); *H01L 2224/05647* (2013.01); *H01L 2224/12105* (2013.01); *H01L 2224/131* (2013.01); *H01L 2224/16145* (2013.01); *H01L 2224/16227* (2013.01); *H01L 2224/32245* (2013.01); *H01L 2224/73209* (2013.01); *H01L 2224/73253* (2013.01); *H01L 2224/73267* (2013.01); *H01L 2224/81005* (2013.01); *H01L 2224/92124* (2013.01); *H01L 2224/92242* (2013.01); *H01L 2224/92244* (2013.01); *H01L 2224/94* (2013.01); *H01L 2224/97* (2013.01); *H01L 2924/1434* (2013.01); *H01L 2924/181* (2013.01); *H01L 2924/18162* (2013.01)

(58) Field of Classification Search
CPC ... H01L 23/3114; H01L 21/78; H01L 21/561; H01L 24/97; H01L 24/19; H01L 24/20; H01L 24/96; H01L 24/94; H01L 2224/94; H01L 2224/04105; H01L 2224/12105; H01L 2224/92244; H01L 2224/16145; H01L 2224/73209; H01L 2224/73253; H01L 2224/73267; H01L 2224/05647; H01L 2224/05624; H01L 2224/81005; H01L 2224/0401; H01L 2224/16227; H01L 2224/131; H01L 2224/32245; H01L 2224/92245; H01L 2224/92242; H01L 2224/92124; H01L 2224/05644; H01L 2224/97

See application file for complete search history.

(56) References Cited

U.S. PATENT DOCUMENTS

| | | | |
|---|---|---|---|
| 2004/0051168 A1* | 3/2004 | Arai | H01L 21/565 438/106 |
| 2004/0075164 A1* | 4/2004 | Pu | H01L 23/3128 257/E21.503 |
| 2005/0017336 A1 | 1/2005 | Kung et al. | |
| 2007/0235215 A1* | 10/2007 | Bathan | H01L 24/97 257/E23.101 |
| 2009/0127680 A1* | 5/2009 | Do | H01L 23/49548 438/122 |
| 2010/0327439 A1* | 12/2010 | Hwang | H01L 23/481 257/737 |
| 2011/0068427 A1* | 3/2011 | Paek | H01L 24/20 257/E21.705 |
| 2011/0147911 A1* | 6/2011 | Kohl | H01L 25/0657 438/109 |
| 2011/0176280 A1* | 7/2011 | Lee | H01L 23/49816 361/721 |
| 2012/0049364 A1* | 3/2012 | Sutardja | H01L 23/3114 257/738 |
| 2012/0061821 A1* | 3/2012 | Black | H01L 24/05 257/E21.585 |
| 2012/0080671 A1* | 4/2012 | Niboshi | H01L 51/524 438/26 |
| 2013/0040423 A1* | 2/2013 | Tung | H01L 21/78 257/E21.602 |
| 2016/0260690 A1 | 9/2016 | Ganesan et al. | |

FOREIGN PATENT DOCUMENTS

| | | |
|---|---|---|
| TW | I231583 B | 4/2005 |
| TW | 200527615 A | 8/2005 |
| TW | 200537660 A | 11/2005 |
| TW | 200832666 A | 8/2008 |
| TW | 200931628 A | 7/2009 |
| TW | I313048 B2 | 8/2009 |
| WO | 2011087798 A1 | 7/2011 |

OTHER PUBLICATIONS

Taiwanese Office Action for Application No. 109104176, completed Mar. 5, 2021, 12 pages.
Taiwanese Office Action for Application No. 111124795, completed Feb. 7, 2023, 10 pages (with English translation).
Taiwanese Office Action for Application No. 111124795, dated Aug. 31, 2023, 15 pages (with English translation).

\* cited by examiner

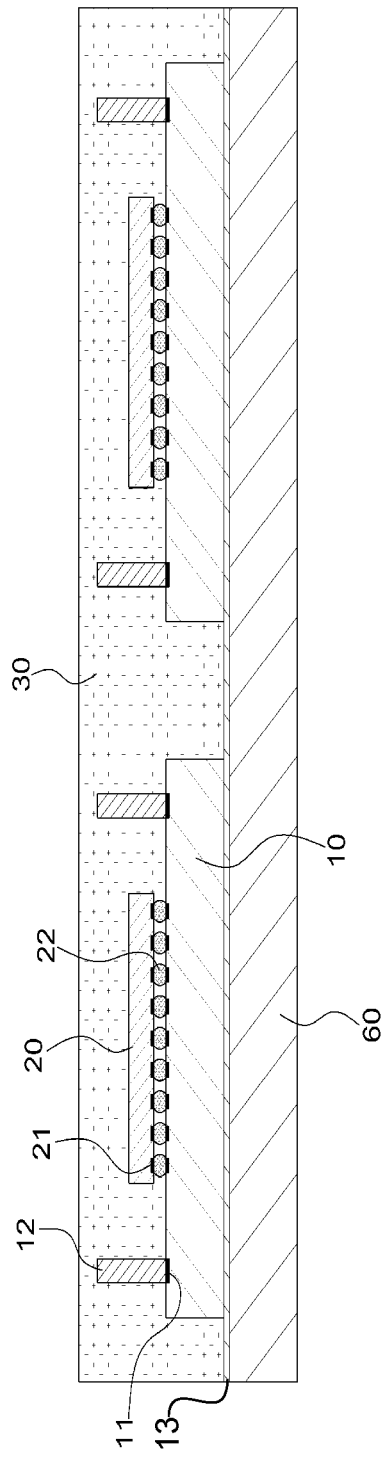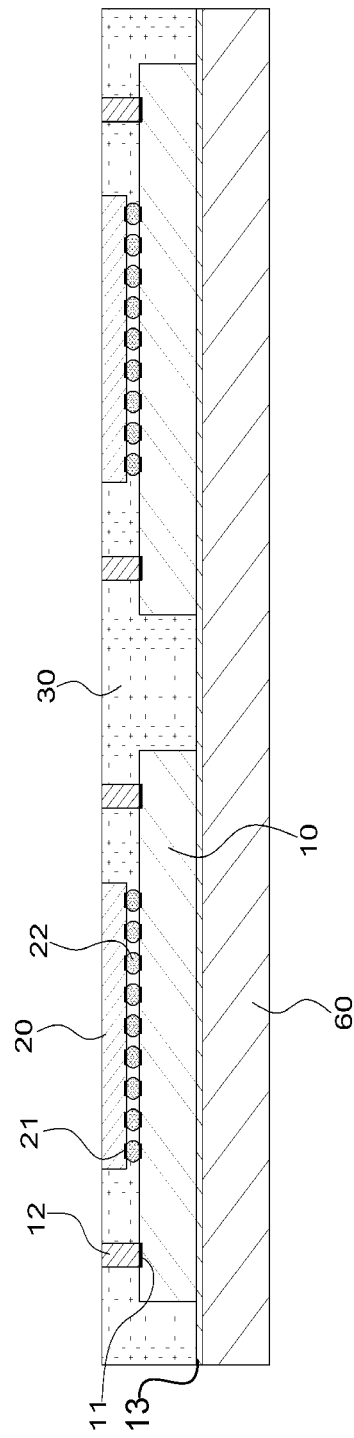

WAFER-LEVEL STACK CHIP PACKAGE AND METHOD OF MANUFACTURING THE SAME

CROSS-REFERENCE TO RELATED APPLICATIONS/INCORPORATION BY REFERENCE

The present application is a continuation of U.S. patent application Ser. No. 14/931,112, filed Nov. 3, 2015, which makes reference to, claims priority to, and claims the benefit of Korean Patent Application No. 10-2014-0152687, filed on Nov. 5, 2014, the contents of which are hereby incorporated herein by reference, in their entirety.

FIELD

The present disclosure relates to a semiconductor product in the form of a stack chip package (e.g., a wafer-level stack chip package), and more particularly to a novel type of stack chip package and a method of manufacturing the same, in which a plurality of semiconductor chips is stacked so as to enable the exchange of electrical signals between the semiconductor chips, and which includes a conductive layer for inputting and outputting signals to and from individual semiconductor chips.

BACKGROUND

Among techniques for packaging semiconductor integrated circuits, three-dimensional (3D) stacking processes have been developed to decrease the size of electronic devices and to increase the mounting density and performance thereof.

Further limitations and disadvantages of conventional and traditional approaches will become apparent to one of skill in the art, through comparison of such systems with some aspects of the present disclosure as set forth in the remainder of the present application with reference to the drawings.

BRIEF DESCRIPTION OF SEVERAL VIEWS OF THE DRAWINGS

FIGS. 2A to 2G are cross-sectional views illustrating a process of manufacturing a semiconductor product in the form of a wafer-level stack chip package according to an example embodiment of the present disclosure.

DETAILED DESCRIPTION

Figure 1A:
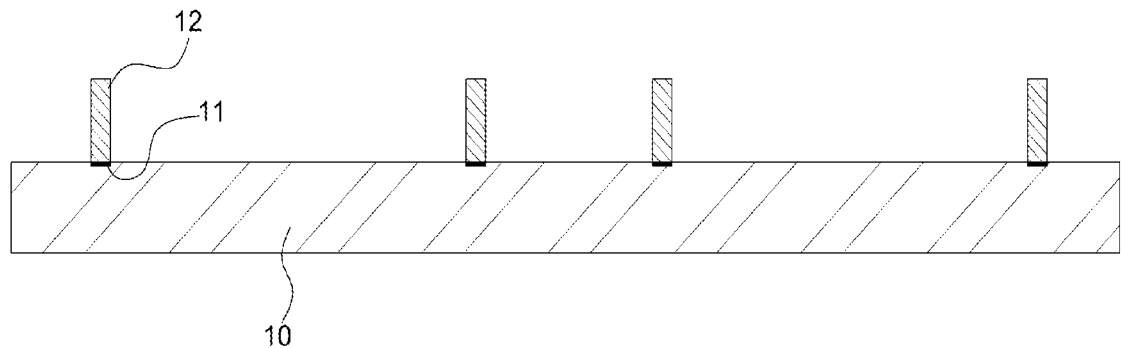
FIGS. 1A to 1G are cross-sectional views illustrating a process of manufacturing a semiconductor product in the form of a wafer-level stack chip package according to an example embodiment of the present disclosure.

Aspects of the present disclosure relate to a semiconductor product package and method of manufacturing the same. More specifically, example embodiments of the present disclosure relate to a semiconductor product in the form of a wafer-level stack chip package, and more particularly to a novel type of stack chip package and a method of manufacturing such a stack chip package, where a plurality of semiconductor chips are stacked so as to enable the exchange of electrical signals between the semiconductor chips, and where a conductive layer is included for inputting and outputting signals to and from individual semiconductor chips.

The term "semiconductor die" in this specification includes, for example, a semiconductor chip having an active circuit and/or a passive circuit, a semiconductor wafer or portion thereof, equivalents thereof, etc.

As utilized herein, the terms "exemplary" or "example" mean serving as a non-limiting example, instance, or illustration. Also, as utilized herein, the term "representative" means serving as a non-limiting example, instance, or illustration.

Hereinafter, examples of embodiments of the present disclosure will be described in detail with reference to the accompanying drawings such that they can readily be made and used by those skilled in the art. It should be noted that the thickness or size of each the illustrated elements may be exaggerated for clarity in the accompanying drawings. Like numbers may refer to like elements throughout. In addition, when it is said that an element is electrically coupled to another element, it will be understood that these elements may be directly coupled to each other and may be coupled to each other with another element interposed between the two coupled elements.

Hereinafter, the embodiments of the present disclosure will be described in detail with reference to the accompanying drawings. In the following, description, well-known functions or constitutions will not be described in detail if they would obscure the subject matter of the present disclosure in unnecessary detail. Further, the terminologies to be described below are defined in consideration of functions in the present disclosure and may vary depending on intentions or practices of a user or an operator. Accordingly, the definition may be made on a basis of the content throughout the specification.

Three-dimensional (3D) stack packages may be configured such that, for example, semiconductor chips having the same memory capacity may be stacked and may be called stack chip memory packages.

Stack chip package technology offers various advantages. For example, processing may be simplified, thus reducing package manufacturing costs and assisting mass production. Some problems are now being seen in the stack chip package space because conventional approaches to wiring electrical interconnections in such stack chip packages are increasingly insufficient in proportion to the number and size of semiconductor chips to be stacked.

In some stack chip packages, semiconductor chips are stacked on and attached to chip attachment regions of a substrate, and bonding pads of individual semiconductor chips may be conductively connected to the conductive circuit patterns of the substrate by means of wires, thus requiring space for wire bonding and the circuit pattern area of the substrate connected by wires, undesirably enlarging the size of the semiconductor package.

In an attempt to resolve these problems, through silicon vias (TSVs) may be formed in semiconductor chips, so that the semiconductor chips may be physically stacked and electrically connected by means of the TSVs, thereby manufacturing a stack chip package having a compact size. However, the formation of TSVs in individual semiconductor chips may be complicated, and may undesirably increase the number of manufacturing processes and the manufacturing cost. Example embodiments of the present disclosure offer a novel stack chip package having an efficient and robust structure and a compact size.

The following is a detailed description of various example embodiments of the present disclosure with reference to the appended drawings. The present disclosure addresses aspects of an example compact stack chip package in which a first semiconductor chip having a relatively large physical size (e.g., a semiconductor chip having a larger area on which electrical components are located, such as a memory device having a large memory capacity, etc.), and a second semiconductor chip having a relatively smaller physical size (e.g., a semiconductor chip having a smaller area on which electrical components are located, such as a memory device having a small memory capacity, etc.) may be conductively stacked on each another. In an example embodiment of the present disclosure, one or more conductive layers, which may also be referred to herein as redistribution layers, are provided to route input and output electrical signals to and from connections on the first and second semiconductor chips. It should be noted that, although an example in terms of memory devices is provided herein, the concepts disclosed herein are not so limited, as the teachings of the present disclosure may equally be applied to other semiconductor chip designs in stack chip packages performing other functions.

FIGS. 1A to 1G are cross-sectional views illustrating a process of manufacturing a semiconductor product in the form of a wafer-level stack chip package according to an example embodiment of the present disclosure. Note that although the first example shows various structures and process steps at the wafer level, such structures and process steps may also be performed at the individual chip or die level (e.g., after excising individual chips or dies from a wafer of dies).

As shown in FIG. 1A, a wafer-level first semiconductor chip 10 (i.e., illustrating a wafer portion corresponding to multiple first semiconductor chips 10 prior to separation or singulation), which may for example be a silicon or other suitable semiconductor material, is provided. Semiconductor chips 10 may include active circuitry, or it may comprise, for example, an interposer formed on silicon prior to the removal of the silicon. According to an example embodiment of the present disclosure, a wafer may be configured such that a plurality of such first semiconductor chips 10 are arranged in transverse and longitudinal directions along sawing lines (not shown). In addition, one or more bonding pads 11, which may for example function as paths for the input and output of electrical signals, may be formed at predetermined intervals over the surface (e.g., face) of the first semiconductor chips 10, and first interconnection structures 12, which may also be referred to herein as conductive bumps, may be bonded to (or formed on) some of the bonding pads 11 of the first semiconductor chips 10. The bonding pads 11 may be formed of, for example, a conductive material such as copper, aluminum, gold, other suitable substance, etc. The first conductive bumps 12 may, for example, comprise conductive pillars or posts (e.g., plated pillars, wires, any of a variety of metallic columns, etc.). The first conductive bumps 12 may, for example, be built directly on the first semiconductor chips 10 (e.g., plated on, etc.) and/or may be preformed and attached to (e.g., soldered to, wire-bonded to, epoxied to, etc.) the first semiconductor chips 10. Note that the following discussion will at times refer to the first semiconductor chips 10 in singular or plural form.

Figure 1B:
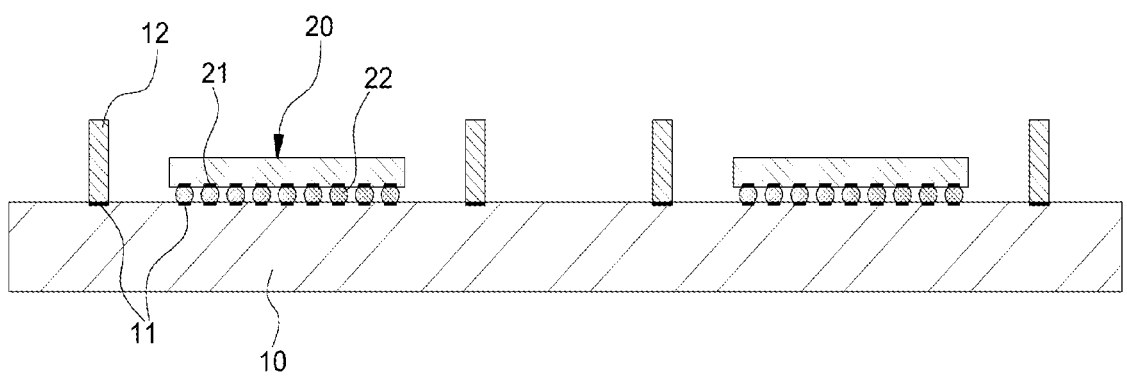

FIG. 1B illustrates placement of second semiconductor chips 20 that are conductively stacked on each of the first semiconductor chips 10 by means of one or more second interconnection structures 22, which may also be referred to herein as conductive bumps. Each of the second semiconductor chips 20 may, for example, be a semiconductor chip having a relatively smaller physical size (e.g., a face surface area on which electrical components may be located) such as, for example, a semiconductor chip having a relatively smaller memory capacity as compared to the first semiconductor chips 10. As shown in the example of FIG. 1B, the second conductive bumps 22 may be attached (e.g., fused, soldered, welded, epoxied, etc.) on bonding pads 21 located on a face or surface of the second semiconductor chips 20 using, for example, a bumping process, and the second conductive bumps 22 may then be bonded to the bonding pads 11 on a face or surface of the first semiconductor chips 10, whereby each of the second semiconductor chips 20 are conductively stacked on and electrically interconnected to respective ones of the first semiconductor chips 10. Note that the second conductive bumps 22 may comprise any of a variety of characteristics (e.g., solder bumps, solder balls, conductive pillars, etc.).

In accordance with an example embodiment of the present disclosure, the first conductive bumps 12 may be bonded to bonding pads 11 on a face (e.g., surface) of the first semiconductor chips 10. The bonding pads 11 may, for example, be positioned proximate an edge (or peripheral) region of each of the first semiconductor chips 10, and the second conductive bumps 22 of each of the second semiconductor chips 20 may be attached to respective bonding pads 11 of a respective first semiconductor chip 10 that are positioned proximate a central portion (or region) of each of the first semiconductor chips 10. For example, the first conductive bumps 12 of each chip stack may surround (or be outside of an area that includes) the second conductive bumps 22.

Thus, each the second semiconductor chips 20 may be conductively stacked on a respective first semiconductor chip 10 of the wafer in a respective central region of the respective first semiconductor chip 10, and the first conductive bumps 12 of each stack chip package may be arranged in a peripheral region around such central region (or around the second semiconductor chip 20).

In one example embodiment of the present disclosure, the upper surfaces (e.g., faces) of the first conductive bumps 12 may be formed to be flush or coplanar with the upper surfaces of the second semiconductor chips 20. In another example embodiment, the first conductive bumps 12 may be formed to be higher than the upper surfaces (e.g., faces) of the second semiconductor chips 20.

In an example embodiment of the present disclosure, the first conductive bumps 12 may be provided in the form of a pillar made of copper or other suitable electrically conductive material having a post shape, the tip of which may be plated with conductive solder, and the second conductive bumps 22 may be provided in the form of, for example, a microbump having a microball shape and may be formed of, for example, a solder or other suitable material.

Figure 1C:
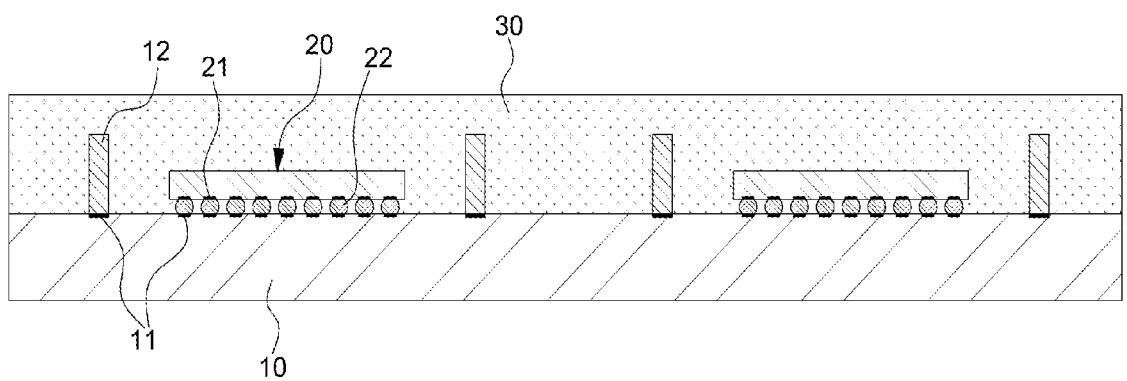

FIG. 1C shows a portion of a wafer such as the wafer portion illustrated in FIGS. 1A, 1B that has been overmolded with a molding compound resin 30 (or any of a variety of encapsulating materials) in which the first conductive bumps 12 and the second semiconductor chips 20 are conductively bonded to the wafer-level first semiconductor chips 10, in accordance with an example embodiment of the present disclosure.

The example molding process shown in FIG. 1C may, for example, enable the second semiconductor chips 20 and the first conductive bumps 12 to be sealed or encapsulated by the molding compound resin 30 so as to protect the second semiconductor chips 20 and the first conductive bumps 12 from the outside environment. In addition, in the example of FIG. 1C, the first conductive bumps 12 and the second conductive bumps 22 are firmly fixed by the molding compound resin 30, and are also electrically insulated from each other.

Figure 1D:
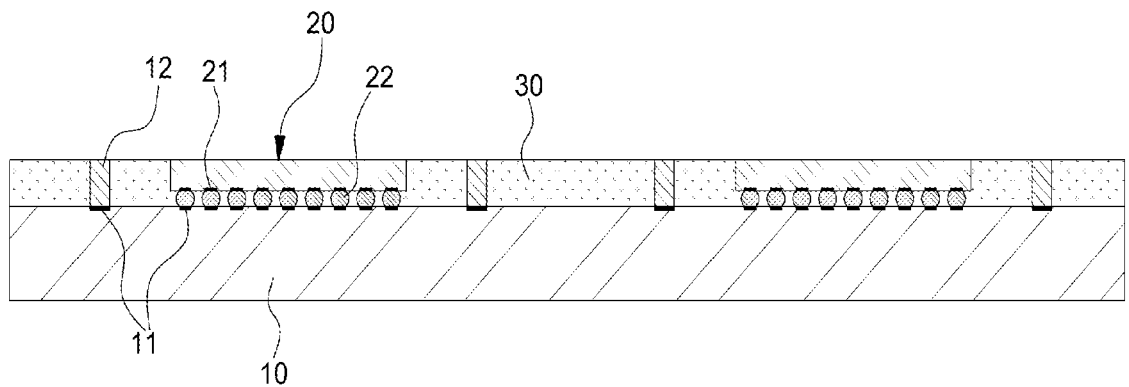

FIG. 1D illustrates a portion of a wafer, such as the wafer portion shown in FIGS. 1A, 1B, 1C, in which the surface of the molding compound resin 30 has been removed using, by way of example and not limitation, chemically etching and/or mechanically grinding until the upper surfaces of the first conductive bumps 12 are exposed externally, in accordance with an example embodiment of the present disclosure. In an example embodiment of the present disclosure, the upper surfaces of the second semiconductor chips 20 may also be exposed by the etching/grinding process, and may be coplanar with the upper surfaces of the first conductive bumps 12. Note that the first conductive bumps 12 may also be shortened at this time to match the height of the second semiconductor chips 20. Also note that in other example embodiments, the upper surfaces of the second semiconductor chips 20 may remain covered by the molding compound resin 30.

In an example embodiment of the present disclosure, the first conductive bumps 12 may be as discussed above, and may be electrically connected to a conductive layer, which may also be referred to herein as a redistribution layer or a portion thereof that enables the electrical interconnection of the inputs and outputs of the first semiconductor chips 10 and the second semiconductor chips 20. As discussed herein, a conductive (e.g., redistribution) layer may for example comprise one or more conductive layers and dielectric layers, and may for example be utilized to route electrical signals.

Figure 1E:
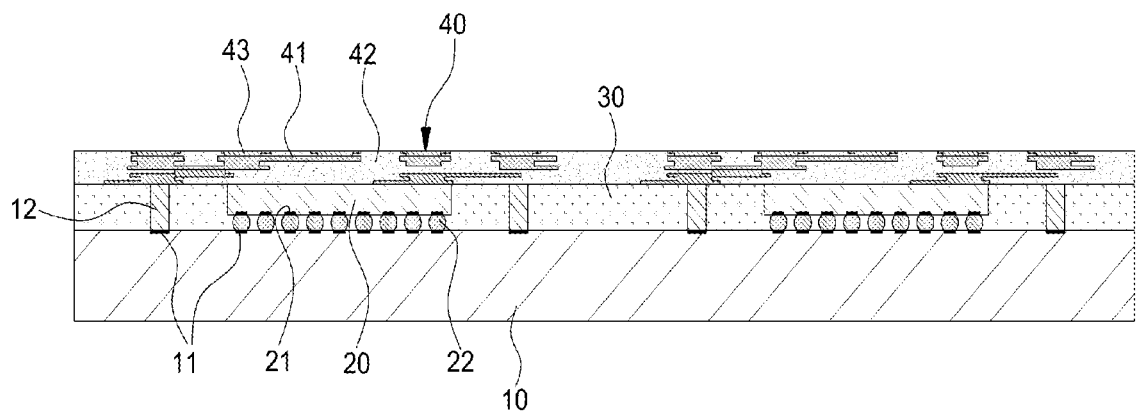

FIG. 1E illustrates a portion of a wafer, such as the wafer of FIGS. 1A, 1B, 1C, 1D, in which a redistribution layer 40 has been formed over the surface of the molding compound resin 30 using a redistribution process so as to be conductively connected to the first conductive bumps 12, in accordance with an example embodiment of the present disclosure. In some example embodiments of the present disclosure, the conductive (e.g., redistribution) layer 40 may formed directly upon an exposed upper surface (e.g., face) of the semiconductor chips 20 and upper surface of the molding compound resin 30, and the upper surfaces of the semiconductor chips 20 and the molding compound resin 30 may be coplanar. Note that in various other example embodiments, for example in which the upper surfaces (e.g., faces) of the semiconductor chips 20 are covered by the molding compound resin 30, the redistribution layer 40 might be formed over but not directly on the semiconductor chips 20.

In an example embodiment of the present disclosure, the redistribution layer 40 may include a plurality of electrically conductive paths 41 such as, for example, metal wiring lines, that electrically interconnect the upper surface of two or more of the first conductive bumps 12, and or electrically interconnect the upper surface of individual first conductive bumps 12 to a desired position on the upper surface of the redistribution layer 40. To enable the first conductive bumps 12 to be densely arranged, the electrically conductive paths 41 may, for example, be enclosed within a dielectric layer 42 made of an insulating material such as, for example, an epoxy, a thermoplastic resin, or other suitable material, in order to electrically insulate the electrically conductive paths 41 from one another other.

As illustrated in FIG. 1E, the electrically conductive paths 41 (e.g., metal wiring lines) of the redistribution layer 40 may be provided in the form of a multilayer structure, with a dielectric layer 42 being interposed between portions of the electrically conductive paths 41.

In an example embodiment of the present disclosure, the conductive (e.g., redistribution) layer 40 includes a plurality of electrically conductive paths 41, one end of each of which may be electrically connected to the upper surface of one of the first conductive bumps 12 using, for example, a plating process, and the other end of which may extend to a desired position on the upper surface of the redistribution layer 40. A dielectric layer 42 encloses the electrically conductive paths 41 so as to electrically insulate them from one other. It should be noted that one or more of the electrically conductive paths 41 may be formed as a plurality of segments or portions that are electrically interconnected within the redistribution layer 40.

In addition to the electrically conductive paths 41, the redistribution layer 40 may include a plurality of electrically conductive pads 43 that may be electrically interconnected to respective electrically conductive paths 41. In the example process illustrated in FIGS. 1A-1G, the electrically conductive pads 43 may be exposed to the outside of the redistribution layer 40 by removing an uppermost portion of the dielectric layer 42 of the redistribution layer 40 of FIG. 1E. The electrically conductive pads 43 exposed by the dielectric layer 42 may, for example, enable the attachment of solder balls (or other conductive interconnection structures) that may be formed on some or all of the electrically conductive pads 43.

Figure 1F:
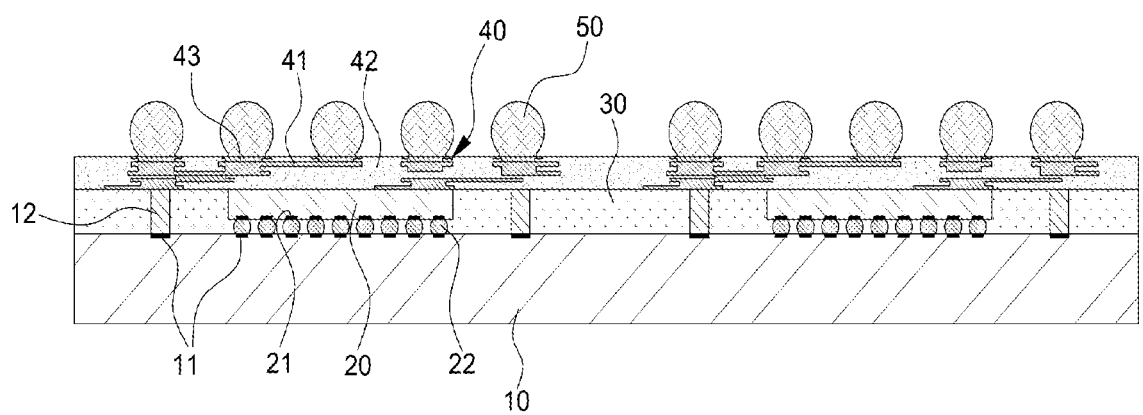

FIG. 1F shows an illustration of a portion of a wafer such as, for example, the wafer portions shown in FIGS. 1A-1E, in which a plurality of conductive input/output terminals or interconnection structures 50 have been attached to respective conductive pads 43 of the conductive (e.g., redistribution) layer 40, in accordance with an example embodiment of the present disclosure. The input/output terminals 50 may be, for example, conductive balls made of a solder or other suitable material.

Figure 1G:
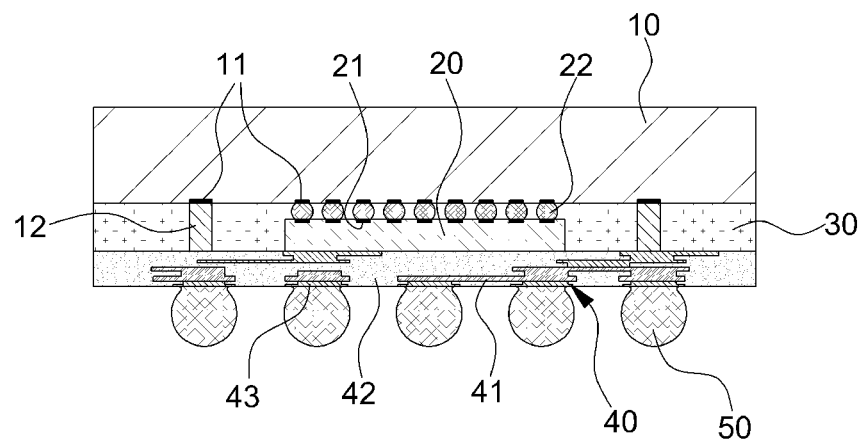

FIG. 1G illustrates an example stack chip package, in accordance with various aspects of the present disclosure. The stack chip package may, for example, correspond to one of the example wafer-level stack chip assemblies shown in FIGS. 1A-1F, following separation or singulation. The example chip stack package in the illustration of FIG. 1G includes a molding compound resin 30 that may correspond to the molding compound resin 30 of FIGS. 1C-1F, for sealing or encapsulating the second semiconductor chips 20 stacked on and electrically connected to the first semiconductor chips 10, and the first conductive bumps 12 that may, for example, correspond to the first conductive bumps 12 of FIGS. 1A-1F. In addition, the illustration of FIG. 1G shows a redistribution layer 40 formed on the surface (e.g., face) of the molding compound resin 30 and/or on the second semiconductor chip 20, which may correspond to, for example, the conductive (e.g., redistribution) layer 40 shown in FIGS. 1E-1F. In the illustration of FIG. 1G, the wafer containing the first semiconductor chips 10 was sawed along sawing lines (not shown) to thus separate or singulate individual stack chip packages, thereby completing a plurality of stack chip packages according to an example first embodiment of the present disclosure. Note that in various example embodiments, additional processes may be performed, for example applying protective layers to exposed die surfaces, etc.

As illustrated in FIG. 1G, the stack chip package according to the first embodiment of the present disclosure may enhance the heat dissipation effects by sawing the wafer-level first semiconductor chip 10 to thus expose the upper and side surfaces (as oriented in FIG. 1G) thereof to the outside.

Furthermore, the second semiconductor chip 20 is embedded between the first semiconductor chip 10 and the redistribution layer 40, whereby the second semiconductor chip may be protected.

According to an example embodiment of the present disclosure as described herein, a stack chip package having a compact size may be obtained by stacking, on a surface (e.g., face) of first semiconductor chip (e.g., a "mother" die) having a relatively larger size and in some embodiments, a relatively larger number of electrical components or memory capacity, a second semiconductor chip (e.g., a "daughter" die) having a surface (e.g., face) of a relatively smaller size and, in some embodiments, a relatively smaller number of electrical components or memory capacity, by means of the conductive bumps so as to enable exchange of the electrical signals between the first semiconductor chip and the second semiconductor chip, and by using a conductive (e.g., redistribution) layer for inputting and outputting signals to and from the individual first and second semiconductor chips, for example in lieu of a thick substrate.

FIGS. 2A to 2G are cross-sectional views illustrating a process of manufacturing a semiconductor product in the form of a wafer-level stack chip package according to an example embodiment of the present disclosure. The example process steps and/or structures shown in FIGS. 2A-2G may, for example, share any or all characteristics with analogous process steps and/or structures shown in FIGS. 1A-1G.

Figure 2A:
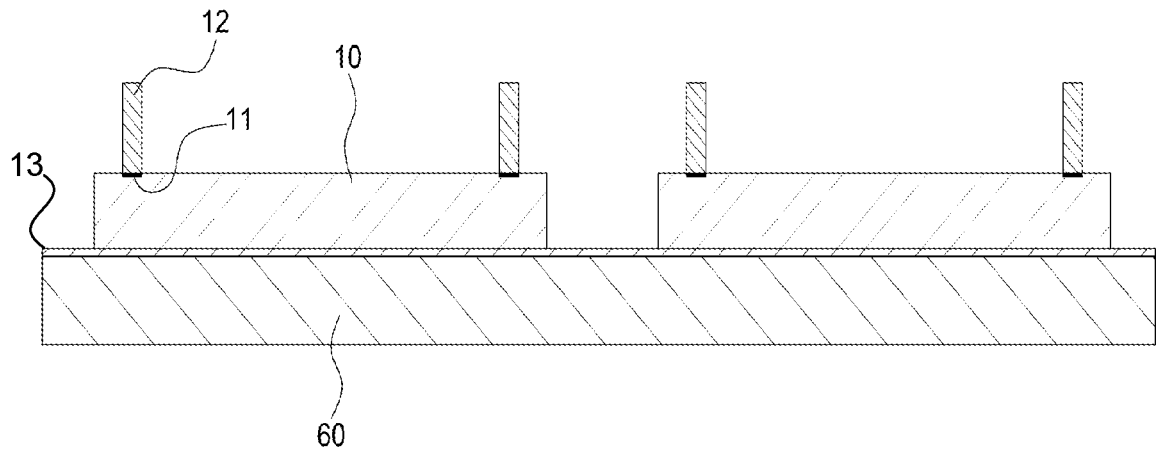

FIG. 2A shows an illustration of example steps in a process of manufacturing a wafer-level stack chip package according to an example embodiment of the present disclosure, in which a wafer may be sawed along sawing lines (not shown), thus forming a plurality of individual first semiconductor chips 10. A first face (e.g., an inactive surface, etc.) of each of the plurality of first semiconductor chips 10 may then be attached (e.g., adhered, etc.) at predetermined intervals (e.g., rows and/or columns) on a substrate or plate 60 (or other carrier), and a plurality of electrically conductive bonding pads 11 may be formed on a second face of each of the first semiconductor chips 10, as shown in FIG. 2A. The attachment of the first semiconductor chips 10 to the metal plate 60 may use, by way of example and not limitation, a thermally conductive adhesive 13, an adhesive film, or any other suitable attachment material. In an example embodiment of the present disclosure, the plate (e.g., substrate) 60 may comprise, for example, copper, aluminum, any other suitable metallic element or alloy, etc.

In an example embodiment according to the present disclosure, the conductive bonding pads 11 may be formed at predetermined intervals over the surface of the first semiconductor chips 10 and may function as paths for the input and output of electrical signals by the first semiconductor chips 10. A plurality of first interconnection structures (e.g., conductive bumps) 12 (e.g., as discussed herein with regard to FIGS. 1A-1G, etc.) may then be bonded to one or more of the conductive bonding pads 11 of the first semiconductor chips 10. Note that the conductive bonding pads 11 may be formed on the first semiconductor chips 10 prior to mounting the first semiconductor chips 10 to the substrate or plate 60, but may also be formed after such mounting.

Figure 2B:
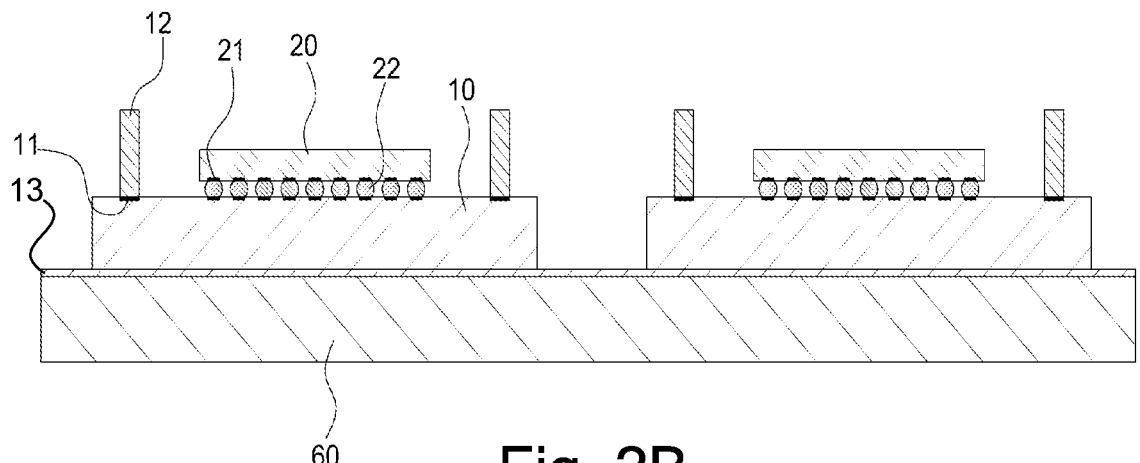

FIG. 2B illustrates example next steps in the example process of FIGS. 2A-2G, in which a plurality of second semiconductor chips 20 are stacked and electrically interconnect to the first semiconductor chips 10 by means of a plurality of interconnection structures such as electrically conductive second conductive bumps 22, in accordance with an example embodiment of the present disclosure. In some example embodiments of the present disclosure, each of the second semiconductor chips 20 may, for example, have a surface (e.g., face) with a relatively smaller physical area and, in some embodiments, a smaller number of electronic components or, in the case of a memory device, a smaller memory capacity, in comparison to that of the first semiconductor chips 10.

As shown in the illustration of FIG. 2B, the second conductive bumps 22 may be attached (e.g., fused, soldered, welded, epoxied, etc.) on a respective plurality of bonding pads 21 of the second semiconductor chips 20, using, for example, a bumping process. The second conductive bumps 22 may be formed of, for example, a solder or other suitable material. The second conductive bumps 22 may then be bonded to one or more of the bonding pads 11 of the first semiconductor chips 10. In this manner, each of the second semiconductor chips 20 may be conductively stacked on and electrically interconnected with a respective one of the first semiconductor chips 10. Note that the second conductive bumps 22 may comprise any of a variety of characteristics (e.g., solder bumps, solder balls, conductive pillars, etc.).

In an example embodiment according to the present disclosure, the first conductive bumps 12 may be bonded to the bonding pads 11 of the first semiconductor chips 10 that are positioned proximate the edge regions (or peripheral regions) of the first semiconductor chips 10. Further, the second conductive bumps 22 of the second semiconductor chips 20 may be attached to the bonding pads 11 of the first semiconductor chips 10 that are positioned proximate the central regions of the first semiconductor chips 10.

In this manner, the second semiconductor chips 20 may be electrically interconnected with the first semiconductor chips 10 by being stacked on the central regions of the first semiconductor chips 10, and the first conductive bumps 12 may be arranged at the edge regions of the first semiconductor chips 10 around the second semiconductor chips 20.

In some example embodiments of the present disclosure, the upper surfaces (e.g., faces) of the first conductive bumps 12 may be formed to be flush or coplanar with the upper surfaces of the second semiconductor chips 20. In other example embodiments of the present disclosure, the first conductive bumps 12 may be formed to be higher than the upper surfaces of the second semiconductor chips 20.

In an example embodiment of the present disclosure, the first conductive bumps 12 may be provided in the form of a pillar having a post shape, the pillar may be made of copper or another suitable conductive material, and the tip of the pillar forming the first conductive bumps 12 may be plated with a conductive solder. In some example embodiments of the present disclosure, the second conductive bumps 22 may be provided in the form of a microbump having a microball shape, and the second conductive bumps 22 may be formed of a solder or other suitable electrically conductive material.

FIG. 2C illustrates example next steps in the process of FIGS. 2A-2G for manufacturing a wafer-level stack chip package according to an example embodiment of the present disclosure. As shown above in FIG. 2B, the first semiconductor chips 10 have been attached to the upper surface of the plate (e.g., substrate) 60 and the second semiconductor chips 20 have been conductively stacked upon the first semiconductor chips 10 by means of the second conductive bumps 22. In addition, the first conductive bumps 12 have been conductively attached (e.g., fused) onto the first semiconductor chips 10. In the process step illustrated in FIG.

2C, the plate 60 with the above-elements attached may then be over-molded with a molding compound resin 30 (or any of a variety of encapsulating materials) that covers the first semiconductor chips 10, the respective second semiconductor chips 20, the first conductive bumps 12, the second conductive bumps 22, and the upper surface of the plate (e.g., substrate) 60.

In an example embodiment of the present disclosure, the above-described molding process may, for example, enable the first semiconductor chips 10, the second semiconductor chips 20, and the first conductive bumps 12 to be sealed or encapsulated by the molding compound resin 30 so as to protect them from the outside environment. Further, in this manner, the first conductive bumps 12 and the second conductive bumps 22 may be firmly fixed by the molding compound resin 30 and are electrically insulated from each other.

FIG. 2D illustrates example next steps in the process of FIGS. 2A-2G, in which the surface of the molding compound resin 30 is removed using, by way of example and not limitation, a chemical etching and/or mechanical grinding process, until the upper surfaces of the first conductive bumps 12 are exposed externally. As shown in the illustration of FIG. 2D, any molding compound resin 30 on the upper surfaces of the first conductive bumps 12 and the second semiconductor chips 20 may be removed until the upper surface (e.g., face) of the second semiconductor chips 20 and the upper surfaces of the first conductive bumps 12 are flush or coplanar with the upper surface of the molding compound resin 30. Note that the first conductive bumps 12 may also be shortened at this time to match the height of the second semiconductor chips 20. Also note that in other example embodiments, the upper surfaces (e.g., faces) of the second semiconductor chips 20 may remain covered by the molding compound resin 30.

In an example embodiment of the present disclosure (e.g., in an example embodiment in which the first conductive bumps are initially completely covered by the molding compound resin 30), the etching or grinding of the upper surface of the molding compound resin 30 exposes the upper surface of the first conductive bumps 12, to enable the electrical interconnection of the input and output signals of each of the first semiconductor chips 10 and respective second semiconductor chips 20.

Figure 2E:
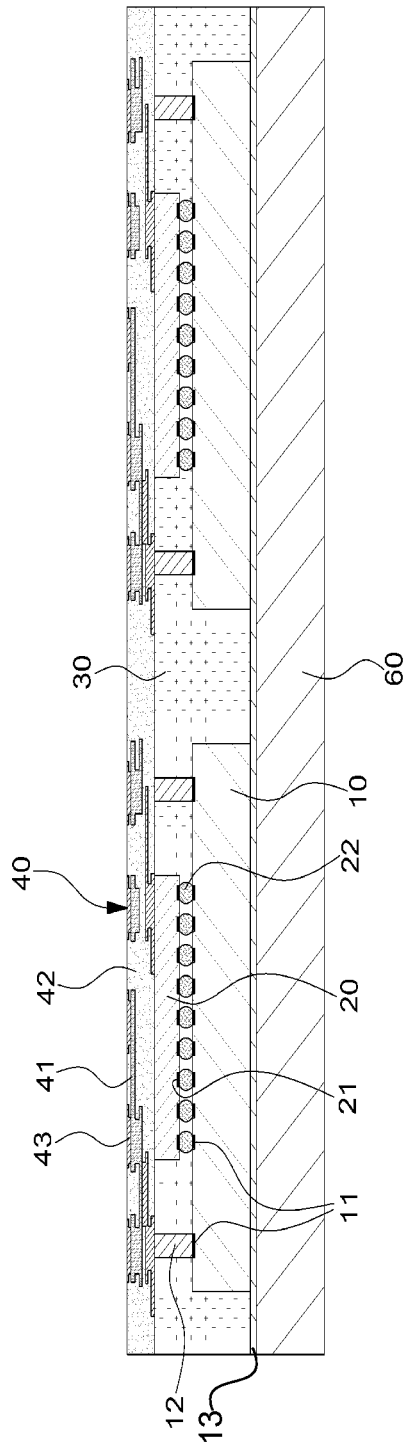

FIG. 2E shows an illustration of example steps in the process of FIGS. 2A-2G, in which a conductive (e.g., redistribution) layer 40 is formed, in a manner similar to that described above with regard to FIGS. 1A-1G, in accordance with various aspects of the present disclosure.

As shown in the example illustrated in FIG. 2E, the conductive (e.g., redistribution) layer 40 may be formed over the upper surface of the molding compound resin 30 using a process such as, for example, the processor described above with respect to FIG. 1E, so as to form the redistribution layer 40 to be conductively connected to one or more of the first conductive bumps 12.

As in the example embodiment illustrated in FIGS. 1A-1G, the conductive (e.g., redistribution) layer 40 may include a plurality of electrically conductive paths 41 such as, for example, metal wiring lines, in which one end of each conductive path 41 is electrically interconnected to a corresponding one of the first conductive bumps 12 using, for example, a plating process, and in which the other end of the conductive path 41 extends to a desired position on the upper surface of the redistribution layer 40. A dielectric layer 42 that encloses the conductive paths 41 (e.g., metal wiring lines) acts to electrically insulate the conductive paths 41 from one another. It should be noted that one or more of the electrically conductive paths 41 may be formed as a plurality of segments or portions that are electrically interconnected within the conductive (e.g., redistribution) layer 40.

In an example embodiment of the present disclosure, a plurality of electrically conductive pads 43 may be formed on some portions of the conductive paths 41 that may be exposed to the outside by partially removing the uppermost portion of the dielectric layer 42 of the redistribution layer 40. A plurality of electrically conductive elements such as, for example, balls made of a conductive material such as a solder or other suitable electrically conductive material may be attached to the electrically conductive pads 43 exposed by the upper surface of the dielectric layer 42 of the redistribution layer 40.

Figure 2F:
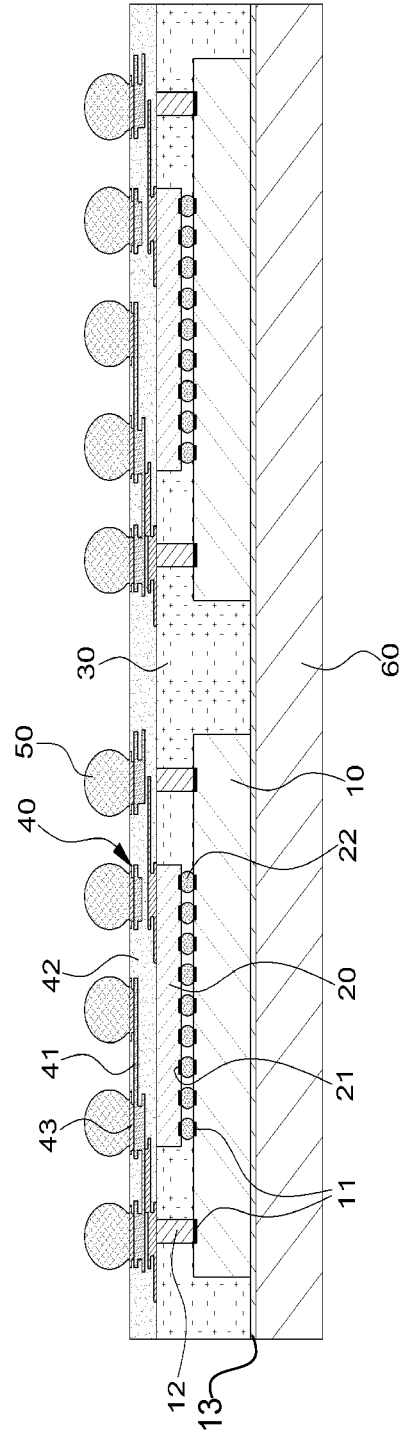

FIG. 2F illustrates example next steps in the example process of FIGS. 2A-2G, in which a plurality of interconnection structures such as input/output terminals 50 may be attached (e.g., fused by welding or soldering) to the conductive pads 43 of the conductive (e.g., redistribution) layer 40. The plurality of input/output terminals 50 may be formed in the shape of a ball, and may comprise, for example, a solder or other suitable electrically conductive material.

Figure 2G:
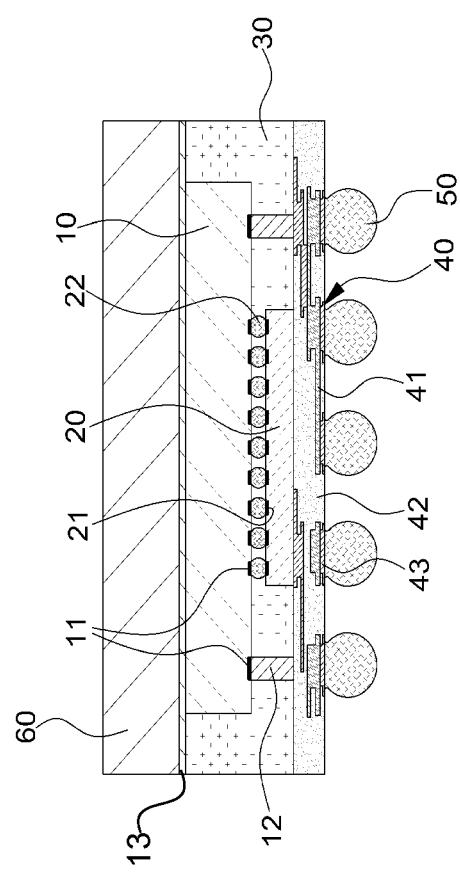

FIG. 2G shows an example stack chip package, in accordance with various aspects of the present disclosure. The stack chip package may, for example, correspond to one of the stack chip assemblies shown in FIGS. 2A-2F, for example resulting from example last steps of the process of FIGS. 2A-2G, in which a plurality of stack chip packages formed as described above are separated or singulated. To produce the stack chip package shown in the illustration of FIG. 2G, the conductive (e.g., redistribution) layer 40, the molding compound resin 30, and the substrate (e.g., plate) 60 as shown in FIG. 2F are sawed along sawing lines (not shown), thus separating or singulating individual stack chip packages, such as that illustrated in FIG. 2G, thereby resulting in a stack chip package according to an example embodiment of the present disclosure.

As illustrated in example of FIG. 2G, the stack chip package according to an example embodiment of the present disclosure is configured such that the substrate or plate 60, which may function as a heat dissipation plate, is attached to the first semiconductor chip 10, thus enhancing the dissipation of heat generated from the first semiconductor chip 10. The attachment of the plate 60 to the first semiconductor chip 10 may use a thermally conductive adhesive 13, an adhesive film, or any other suitable attachment material. In such a configuration, the side surfaces of the substrate (e.g., plate) 60, the molding compound resin, and the conductive (e.g., redistribution) layer 40 may be coplanar. Note that in other example embodiments, the plate 60 may be removed from the rest of the assembly (e.g., before and/or after separation of the individual packages from each other), for example resulting in a package like that shown in FIG. 1G, with or without the sides of the first semiconductor die 10 covered by the molding compound resin 30.

In addition, the second semiconductor chip 20 is embedded between the first semiconductor chip 10 and the redistribution layer 40, thereby protecting the second semiconductor chip 20.

According to an example embodiment of the present disclosure as discussed herein, for example with respect to FIGS. 2A-2G, a semiconductor product in the form of a stack chip package having a compact size may be obtained by stacking, on a first semiconductor chip (e.g., a "mother" die) having, in some example embodiments, a face with a relatively larger physical area and relatively larger number of electronic components or, for example in a memory device, a relatively larger memory capacity, a second semiconductor chip (e.g., a "daughter" die) having a face with a relatively smaller physical area and relatively smaller number of electronic components or, for example in a memory device, a relatively smaller memory capacity. The stacking may be accomplished by means of a plurality of conductive bumps that electrically interconnect the first semiconductor chip and the second semiconductor chip, so as to enable the exchange of electrical signals between the first semiconductor chip and the second semiconductor chip, by using a redistribution layer for inputting and outputting signals to and from the individual semiconductor chips, for example in lieu of a thick substrate.

Although preferred embodiments of the present disclosure have been disclosed for illustrative purposes, those skilled in the art will appreciate that various modifications, additions, and substitutions are possible, without departing from the scope and spirit of the present disclosure, as disclosed in the accompanying claims.

Therefore, the embodiments of the present disclosure have been made keeping in mind problems encountered in the related art. An example objective of the present disclosure is to provide a wafer-level stack chip package and a method of manufacturing the same, wherein second semiconductor chips having a small size are stacked on a wafer-level first semiconductor chip by means of conductive bumps so as to enable the exchange of electrical signals therebetween, and a redistribution layer is adopted to enable input and output signals to pass to and from individual semiconductor chips, for example in lieu of a thick substrate, thereby enabling the fabrication of a stack chip package having a compact size and maximizing heat dissipation effects with the addition of a heat dissipation unit.

In order to accomplish the above objective, a wafer-level stack chip package according to an embodiment of the present disclosure may comprise a first semiconductor chip; first conductive bumps conductively bonded to some of the bonding pads of the first semiconductor chip; and a second semiconductor chip having bonding pads and second conductive bumps bonded thereto. An example embodiment of the present disclosure may also comprise a molding compound resin for sealing or encapsulating the second semiconductor chip and the first conductive bumps, under the condition that the second conductive bumps are bonded to remaining bonding pads of the first semiconductor chip and thereby the second semiconductor chip is conductively stacked on the first semiconductor chip. An example embodiment of the present disclosure may further comprise a conductive layer conductively connected to the first conductive bumps and formed over a surface of the molding compound resin using a redistribution process; and input/output terminals fused on conductive pads exposed through a surface of the redistribution layer.

In addition, a method of manufacturing a wafer-level stack chip package according to an example embodiment of the present disclosure may comprise providing a wafer-level first semiconductor chip; conductively bonding first conductive bumps to some of bonding pads of the first semiconductor chip; and providing a second semiconductor chip having bonding pads and second conductive bumps bonded thereto. The example method may also comprise bonding the second conductive bumps to remaining bonding pads of the first semiconductor chip, so that the second semiconductor chip is conductively stacked on the first semiconductor chip; and over-molding a surface of the first semiconductor chip with a molding compound resin so that the second semiconductor chips and the first conductive bumps are sealed or encapsulated. In addition, the example method may comprise grinding a surface of the molding compound resin until upper surfaces of the first conductive bumps are exposed externally; forming a conductive layer over the surface of the molding compound resin using a redistribution process so as to conductively connect the redistribution layer to the first conductive bumps; and bonding input/output terminals to conductive pads exposed through a surface of the redistribution layer.

In addition, a wafer-level stack chip package according to an example embodiment of the present disclosure may comprise a first semiconductor chip; first conductive bumps conductively bonded to some of bonding pads of the first semiconductor chip; and a second semiconductor chip having bonding pads and second conductive bumps bonded thereto. The wafer-level stack chip package may also comprise a molding compound resin for sealing or encapsulating the first semiconductor chip, the second semiconductor chip and the first conductive bumps, under the condition that the second conductive bumps are bonded to remaining bonding pads of the first semiconductor chip and thereby the second semiconductor chips are conductively stacked on the first semiconductor chips. The wafer-level stack chip package may further comprise a conductive layer conductively connected to the first conductive bumps and formed over a surface of the molding compound resin using a redistribution process; a substrate or plate attached to surfaces of the first semiconductor chips opposite surfaces thereof connected to the second semiconductor chips so as to enable the dissipation of heat; and input/output terminals fused on conductive pads exposed through a surface of the redistribution layer.

In addition, a method of manufacturing a wafer-level stack chip package according to an example embodiment of the present disclosure may comprise attaching a first semiconductor chip, which is separated or singulated from a wafer into individual units, at predetermined intervals on a substrate or plate; conductively bonding first conductive bumps to some of bonding pads of the first semiconductor chip; and providing a second semiconductor chip having bonding pads and second conductive bumps bonded thereto. Such a method may also comprise bonding the second conductive bumps to remaining bonding pads of the first semiconductor chip, so that the second semiconductor chips are conductively stacked on the first semiconductor chip; and over-molding a surface of the metal plate with a molding compound resin so that the first semiconductor chip, the second semiconductor chip, and the first conductive bumps are sealed or encapsulated. The method may further comprise grinding a surface of the molding compound resin until upper surfaces of the first conductive bumps are exposed externally; forming a conductive layer over the surface of the molding compound resin using a redistribution process so as to conductively connect the conductive layer to the first conductive bumps; and bonding input/output terminals to conductive pads exposed through a surface of the redistribution layer.

According to various aspects of the present disclosure, the following effects are exhibited.

First, a stack chip package having a compact size can be manufactured by stacking, on a wafer-level first semiconductor chip (e.g., a mother die), a second semiconductor chip (e.g., a daughter die) by means of conductive bumps so as to enable the exchange of electrical signals therebetween, and by using a conductive (e.g., redistribution) layer for inputting and outputting signals to and from individual semiconductor chips, in lieu of a thick substrate.

Second, a substrate such as a metal plate for dissipating heat may be attached to a first semiconductor chip while first and second semiconductor chips are stacked one on another, thereby enhancing the heat dissipation effects for emitting heat generated from the semiconductor chips to the outside.

Various aspects of the present disclosure may be seen in a semiconductor product comprising a first semiconductor chip having a first surface and a second surface opposite the first surface of the first semiconductor chip, and a first interconnection structure coupled to a first bonding pad on the first surface of the first semiconductor chip. The second semiconductor chip may comprise a first surface and a second surface opposite the first surface of the second semiconductor chip, where the first surface of the second semiconductor chip may comprise a bonding pad. The semiconductor product may also comprise a second interconnection structure coupled to the bonding pad on the first surface of the second semiconductor chip, where the bonding pad on the first surface of the second semiconductor chip is coupled to a second bonding pad on the first surface of the first semiconductor chip. An encapsulating material may encapsulate at least the first surface of the first semiconductor chip and the first interconnection structure. A conductive layer may be coupled to the first interconnection structure at a surface of the encapsulating material, and a third interconnection structure may be coupled to the conductive layer.

In some example embodiments of the present disclosure, the surface area of the first surface of the first semiconductor chip may be larger than the surface area of the first surface of the second semiconductor chip. The second bonding pad may be located in a central region of the first surface of the first semiconductor chip, and the first bonding pad may be located in a peripheral region of the first surface of the first semiconductor chip outside of the central region. The second surface of the first semiconductor chip and one or more side surfaces connecting the first surface and the second surface of the first semiconductor chip may be exposed, the first interconnection structure may comprise a conductive pillar, and the third interconnection structure may comprise a solder ball. In addition, side surfaces of the first semiconductor chip, the encapsulating material, and the conductive layer may be coplanar. In an example embodiment of the present disclosure, the first semiconductor chip may comprise a memory device of a first storage capacity and the second semiconductor chip may comprise a memory device of a second storage capacity smaller that the first storage capacity.

Additional aspects of the present disclosure may be found in an example method of manufacturing a semiconductor product. Such a method may comprise providing a first semiconductor chip, and forming a first interconnection structure on a first bonding pad on a first surface of the first semiconductor chip. The method may also comprise providing a second semiconductor chip comprising a first surface comprising a bonding pad on which second interconnection structure is formed, coupling the second interconnection structure to a second bonding pad on the first surface of the first semiconductor chip, and encapsulating at least the first surface of the first semiconductor chip with an encapsulating material so that the second semiconductor chip and the first interconnection structure are encapsulated. In addition, such a method may comprise removing a portion of the encapsulating material to expose a portion of the first interconnection structure, forming a conductive layer over the surface of the encapsulating material to electrically couple the conductive layer to the exposed first interconnection structure, and forming a third interconnection structure coupled to the conductive layer.

In an example embodiment of the present disclosure, the second bonding pad may be located in a central region of the first surface of the first semiconductor chip, and the first bonding pad may be located in a peripheral region of the first surface of the first semiconductor chip outside of the central region. Providing the first semiconductor chip may comprise providing the first semiconductor chip in a wafer, and further comprising, after at least said forming a conductive layer, singulating the first semiconductor chip from the wafer. The first surface of the first semiconductor chip may have a surface area of a first size and the first surface of the second semiconductor chip may have a surface area that is smaller than the surface area of the first surface of the first semiconductor chip. Corresponding edges of the first surface and the second surface of the first semiconductor chip may be connected by side surfaces, and the encapsulating material may encapsulate the side surfaces of the first semiconductor chip.

Yet other aspects of the present disclosure may be observed in an example semiconductor product comprising a first semiconductor chip comprising a first surface and a second surface opposite the first surface of the first semiconductor chip, and a first interconnection structure formed on a first bonding pad on the first surface of the first semiconductor chip. Such an embodiment may comprise a second semiconductor chip comprising a first surface and a second surface opposite the first surface of the second semiconductor chip, where the first surface of the second semiconductor chip comprises a bonding pad onto which is formed a second interconnection structure that electrically interconnects the second semiconductor chip to a second bonding pad on the first surface of the first semiconductor chip. Such a semiconductor product may comprise an encapsulating material encapsulating at least the first surface of the first semiconductor chip and the first interconnection structure, a conductive layer electrically coupled to the first interconnections structure at a surface of the encapsulating material, and a substrate coupled to the second surface of the first semiconductor chip. In addition, a third interconnection structure may be coupled to the conductive layer.

In an example embodiment of the present disclosure, the surface area of the first surface of the first semiconductor chip may be larger than the surface area of the first surface of the second semiconductor chip. The second bonding pad may be located in a central region of the first surface of the first semiconductor chip, and the first bonding pad may be located in a peripheral region of the first surface of the first semiconductor chip outside of the central region. The first interconnection structure may comprise a conductive pillar; the substrate may be coupled to the second surface of the first semiconductor chip using an adhesive; the substrate may comprise one of a silicon material, a glass, and a metal; and the third interconnection structure may comprise a solder ball. Side surfaces of the substrate, the encapsulating material, and the conductive layer may be coplanar. Further, the first semiconductor chip may comprise a memory device of a first storage capacity, and the second semiconductor chip may comprise a memory device of a second storage capacity smaller that the first storage capacity.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A semiconductor device, comprising:
 a redistribution structure comprising a redistribution structure top side and a redistribution structure bottom side;
 a lower semiconductor chip comprising a lower chip top side and a lower chip bottom side, wherein the lower chip bottom side is coupled to the redistribution structure top side, and wherein the lower chip top side comprises a lower chip first bonding pad;
 an upper semiconductor chip over the lower semiconductor chip, wherein the upper semiconductor chip comprises an upper chip top side and an upper chip bottom side, wherein the upper chip bottom side comprises an upper chip first bonding pad coupled to the lower chip first bonding pad, and wherein the upper chip bottom side comprises an upper chip second bonding pad located beyond a periphery of the lower semiconductor chip;
 an interconnection structure comprising an interconnection structure top side and an interconnection structure bottom side, wherein the interconnection structure bottom side is coupled to the redistribution structure top side, and wherein the interconnection structure top side is coupled to the upper chip second bonding pad;
 a plate comprising a plate top side and a plate bottom side, wherein the plate bottom side is over the upper chip top side; and
 a single encapsulant layer comprising an encapsulant top side and an encapsulant bottom side, wherein the single encapsulant layer encapsulates and directly contacts at least a portion of the lower semiconductor chip, a portion of the upper semiconductor chip, a portion of the interconnection structure, and a portion of the plate.

2. The semiconductor device of claim 1, wherein:
 the plate top side comprises a planar surface that extends from a first perimeter edge of the plate top side to an opposite second perimeter edge of the plate top side; and
 the plate bottom side comprises a planar surface that extends from a first perimeter edge of the plate bottom side to an oppose second perimeter edge of the plate bottom side.

3. The semiconductor device of claim 2, wherein the plate comprises a metal plate.

4. The semiconductor device of claim 1, wherein the single encapsulant layer extends vertically between and directly contacts the upper chip bottom side and the lower chip top side.

5. The semiconductor device of claim 1, wherein the redistribution structure bottom side comprises an input/output (I/O) terminal of the semiconductor device.

6. The semiconductor device of claim 1, comprising a conductive bump comprising:
 a bump lower end coupled to the lower chip first bonding pad; and
 a bump upper end coupled to the upper chip first bonding pad.

7. The semiconductor device claim 1, wherein the upper chip bottom side has a greater surface area than the lower chip top side.

8. The semiconductor device of claim 1, wherein:
 the interconnection structure comprises a conductive pillar;
 a top side the conductive pillar is coupled to redistribution structure top side; and
 a bottom side of the conductive pillar is coupled to the upper chip second bonding pad.

9. A semiconductor device, comprising:
 a redistribution structure comprising a redistribution structure top side and a redistribution structure bottom side;
 a lower semiconductor chip comprising a lower chip top side, a lower chip bottom side, and a lower chip sidewall adjoining the lower chip top side and the lower chip bottom side, wherein the lower chip bottom side faces the redistribution structure top side, and wherein the lower chip top side comprises a lower chip first bonding pad;
 an upper semiconductor chip comprising an upper chip top side and an upper chip bottom side, wherein the upper chip bottom side comprises an upper chip first bonding pad coupled to the lower chip first bonding pad, and wherein the upper chip bottom side comprises an upper chip second bonding pad located beyond a periphery of the lower semiconductor chip;
 a plate comprising a plate bottom side over the upper chip top side;
 a conductive pillar comprising a pillar upper end coupled to the upper chip second bonding pad, a pillar lower end coupled to the redistribution structure top side, and a pillar sidewall extending between the pillar upper end and the pillar lower end, wherein the pillar sidewall traverses the lower chip sidewall beyond the periphery of the lower semiconductor chip; and
 a single encapsulant layer comprising an encapsulant layer bottom side and an encapsulant layer top side, wherein:
  the encapsulant layer bottom side directly contacts at least a portion of the redistribution structure top side;
  the encapsulant layer top side directly contacts at least a portion of the plate;
  the single encapsulant layer extends continuously between the redistribution structure top side and the plate bottom side; and
  the single encapsulant layer encapsulates and directly contacts at least a portion of the lower chip sidewall, a portion of the upper chip bottom side, a portion of the plate, and a portion of the conductive pillar.

10. The semiconductor device of claim 9, wherein:
 the plate comprises a planar top side;
 the plate bottom side over the upper chip top side is planar; and
 the single encapsulant layer directly contacts at least a portion of the plate bottom side.

11. The semiconductor device of claim 9, wherein the plate comprises a glass.

12. The semiconductor device of claim 9, wherein:
 the upper semiconductor chip comprises an upper chip sidewall adjoining the upper chip top side and the upper chip bottom side; and
 the single encapsulant layer directly contacts at least a portion of the upper chip sidewall.

13. The semiconductor device of claim 9, wherein the redistribution structure bottom side comprises an input/output (I/O) terminal of the semiconductor device.

14. The semiconductor device of claim 9, comprising a conductive bump comprising:
   a bump lower end coupled to the lower chip first bonding pad of the lower chip top side; and
   a bump upper end coupled to the upper chip first bonding pad of the upper chip bottom side.

15. The semiconductor device of claim 14, wherein the single encapsulant layer extends between the upper semiconductor chip and the lower semiconductor chip and directly contacts at a least portion of the conductive bump.

16. The semiconductor device claim 9, wherein the upper chip bottom side has a greater surface area than the lower chip top side.

17. A method of forming a semiconductor device, the method comprising:
   providing a plate having a top side and a bottom side;
   attaching a top side of an upper semiconductor chip to the bottom side of the plate;
   attaching a top side of a lower semiconductor chip to a bottom side of the upper semiconductor chip such that a first bonding pad on the top side of the lower semiconductor chip is coupled to a first bonding pad on the bottom side of the upper semiconductor chip;
   coupling an upper end of an interconnection structure to a second bonding pad on the bottom side of the upper semiconductor chip, wherein the second bonding pad is located beyond a periphery of the lower semiconductor chip, wherein a side of the interconnection structure extends between the upper end of the interconnection structure to a lower end of the interconnection structure, and wherein the side of the interconnection structure traverses a sidewall of the lower semiconductor chip beyond the periphery of the lower semiconductor chip;
   providing a single encapsulant layer comprising an encapsulant layer top side and an encapsulant layer bottom side such that the single encapsulant layer encapsulates and directly contacts at least a portion of the lower semiconductor chip, a portion of the upper semiconductor chip, and a portion of the interconnection structure; and
   providing a redistribution structure on the encapsulant layer bottom side, a bottom side of the lower semiconductor chip, and a lower end of the interconnection structure.

18. The method of claim 17, wherein the plate comprises a glass.

19. The method of claim 17, wherein providing the single encapsulant layer comprises encapsulating the upper semiconductor chip and the lower semiconductor chip such that the single encapsulant layer extends between the upper semiconductor chip and the lower semiconductor chip and directly contacts at least a portion of the bottom side of the upper semiconductor chip, a portion of a sidewall of the upper semiconductor chip, and a portion of a top side of the lower semiconductor chip.

20. The method of claim 17, comprising attaching an input/output (I/O) terminal of the semiconductor device to a bottom side of the redistribution structure.

* * * * *